(12) United States Patent
Gristede et al.

(10) Patent No.: US 6,175,949 B1
(45) Date of Patent: Jan. 16, 2001

(54) METHOD AND SYSTEM FOR SELECTING SIZES OF COMPONENTS FOR INTEGRATED CIRCUITS

(75) Inventors: George D. Gristede, Cross River; Wei Hwang, Armonk; Christophe Robert Tretz, Riverdale, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/046,826

(22) Filed: Mar. 24, 1998

(51) Int. Cl.$^7$ ........................................................ G06F 17/50
(52) U.S. Cl. ............................. 716/11; 716/6; 716/5
(58) Field of Search ................... 716/2, 6, 1, 12, 716/19

(56) References Cited

U.S. PATENT DOCUMENTS

| | | | |
|---|---|---|---|
| 4,827,428 | * 5/1989 | Dunlop et al. | 395/500.07 |
| 5,459,673 | * 10/1995 | Carmean et al. | 395/500.07 |
| 5,619,418 | * 4/1997 | Blaauw et al. | 395/500.07 |
| 5,654,898 | * 8/1997 | Roetcisoender et al. | 364/490 |
| 5,673,198 | * 9/1997 | Lawman et al. | 364/488 |
| 5,764,531 | * 6/1998 | Kojima et al. | 364/490 |
| 5,768,158 | * 6/1998 | Adler et al. | 364/578 |
| 5,790,415 | * 8/1998 | Pullela et al. | 395/500.07 |
| 5,850,348 | * 12/1998 | Berman | 364/488 |
| 5,880,967 | * 3/1999 | Jyu et al. | 395/500.07 |

OTHER PUBLICATIONS

Fisher et al., "Formal Specification and Verification of Graphical User Interfaces," IEEE 1991, pp. 114–123.*

Charles Zukowski et al., "CMOS Transistor Sizing for Minimization of Energy–Delay Product", Dept. of Electrical Engineering, Columbia University, pp. 1–3, No Date.*

Christopher Tretz et al., "CMOS Transistor Sizing for Minimization of Energy–Delay Product", Proceedings, The Sixth Great Lakes Symposium on VLSI, Mar. 22–23, 1996, IEEE Computer Society Press, pp. 168–173.*

Neil H. E. Weste et al., "Principles of CMOS VLSI Design—A Systems Perspective", Second Edition, Addison–Wesley Publishing Company, pp. 216–230, No Date.*

Lance A. Glasser et al., "The Design and Analysis of VLSI Circuits", Addison–Wesley Publishing Company, Inc., 1985, pp. 253–263.*

* cited by examiner

*Primary Examiner*—Paul R. Lintz
*Assistant Examiner*—Leigh Marie Garbowski
(74) *Attorney, Agent, or Firm*—F. Chau & Associates, LLP

(57) ABSTRACT

A method of automatically selecting object size in an integrated circuit includes the steps of providing a circuit topology having objects disposed therein, inputting equations associated with the objects to provide sizing adjustment for the objects, assigning parameter values in the equations based on physical constraints of the circuit for one or more objects, selecting one or more objects to be sized, evaluating cones of influence for the objects selected to identify influenced objects influenced by a change in the selected object and computing for each selected object and influenced objects, a size in accordance with the associated equation until a user defined criteria is achieved for the circuit. A system for performing the method of the present invention is also described.

30 Claims, 6 Drawing Sheets

METHOD AND SYSTEM FOR SELECTING SIZES OF COMPONENTS FOR INTEGRATED CIRCUITS

BACKGROUND OF THE INVENTION

1. Field of the Invention

The present invention relates to circuit design tools and, more particularly, to a system and method for selecting sizes of components for integrated circuits.

2. Description of the Related Art

The design of integrated circuits, for example very large scale integration (VLSI) circuits may be very time consuming and labor intensive. Many iterations are performed before a chip design is completed. The iterations required of chip designers often includes the following procedure:

1. Choose the logic and topology of the circuit to be designed.

2. Choose the initial sizes of the transistors and/or components to attempt to obtain the desired target performance of the circuit to be designed. This selection process typically involves an extensive visual inspection of the circuit and many hand calculations by the designer.

3. Run timing verification using computer aided design tools on the circuit to verify that the circuit has met its target performance.

4. If the desired target performance is not met, adjust the component, for example a transistor, sizes based on the timing results and repeat step 3. The adjustment of the component sizes in this step also includes an extensive visual inspection of the circuit and many calculations that are often performed by hand.

5. If it is not possible to meet the desired target performance using steps 3–4, alter the circuit topology and repeat steps 2–4. In addition, the designer needs to be able to obtain early estimates of circuit performance such that decisions can be made as early as possible as to whether a change in the circuit topology is essential to improve performance.

Steps 2 through 4 may be referred to as tuning steps for "tuning" the circuit. The conventional method as described above tends to be very time consuming and labor intensive. The conventional method usually relies on calculating an RC network in order to evaluate the circuit since this technique lends itself more readily to hand calculations. Therefore, a need exists for an improved system and method for tuning an integrated circuit which provides early estimates of maximum performance and rapid selection of component sizes that meets or exceeds desired performance. A further need exists for providing a more user friendly design tool for analyzing integrated circuit designs.

SUMMARY OF THE INVENTION

A method of automatically selecting object size in an integrated circuit includes the steps of providing a circuit topology having objects disposed therein, inputting equations associated with the objects to provide sizing adjustment for the objects, assigning parameter values in the equations based on physical constraints of the circuit for one or more objects, selecting one or more objects to be sized, evaluating cones of influence for the objects selected to identify influenced objects influenced by a change in the selected object and computing for each selected object and influenced objects, a size in accordance with the associated equation until a user defined criteria is achieved for the circuit.

In alternate methods, the step of outputting a topology with object sizes modified according to the associated equations may be included. The objects may include transistors, and capacitors and may further include the step of modeling the capacitors as transistors by adjusting a capacitance load of the capacitors in accordance with a capacitance conversion factor. The objects may further include hierarchical circuits, vectorized hierarchical circuits, and/or parameterized cells. The step of calculating node loads for analyzing the circuit in accordance with the user defined criteria may also be included. The physical constraints may include gain and the parameter may be a multiplier.

Another method of automatically selecting object size in an integrated circuit includes the steps of providing a circuit topology having objects disposed therein, inputting equations associated with the objects to provide sizing adjustment for the objects, assigning parameter values in the equations based on physical constraints of the circuit for one or more objects, locking one or more objects in the circuit to prevent sizing adjustment to locked objects thereby creating an unlocked subset of objects, evaluating cones of influence for the subset of objects to identify influenced objects influenced by a change in the selected object and computing for each of the subset of objects and influenced objects, a size in accordance with the associated equation until a user defined criteria is achieved for the circuit.

In alternate methods, the step of outputting a topology with objects in the circuit having modified sizes may be included. The objects may include transistors, and capacitors and may further include the step of modeling the capacitors as transistors by adjusting a capacitance load of the capacitors in accordance with a capacitance conversion factor. The objects may further include hierarchical circuits and subcircuits, vectorized hierarchical circuits and/or parameterized cells. The step of calculating node loads for analyzing the circuit in accordance with the user defined criteria may also be included. The physical constraints include gain and the parameter may be a multiplier.

A system for automatically selecting object size in an integrated circuit includes a circuit topology having objects disposed therein, means for inputting equations associated with the objects to provide sizing adjustment for the objects, the equations including parameter values for one or more objects based on physical constraints of the circuit, means for selecting one or more objects to be sized, means for evaluating cones of influence for the objects selected to identify influenced objects influenced by a change in the selected object and means for computing for each selected object and influenced objects, a size in accordance with the associated equation until a user defined criteria is achieved for the circuit.

In alternate embodiments, means for outputting a topology with objects in the circuit sized in accordance with the associated equations may be included. The objects may include transistors and capacitors and may further include a capacitance conversion factor for modeling capacitance loads as transistors. The objects may further include hierarchical circuits, vectorized hierarchical circuits and/or parameterized cells. The physical constraints may include values for a gain of the objects and the parameter may be a multiplier. The means for evaluating cones of influence for the objects may include a processor for analyzing the circuit to identify influenced objects.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
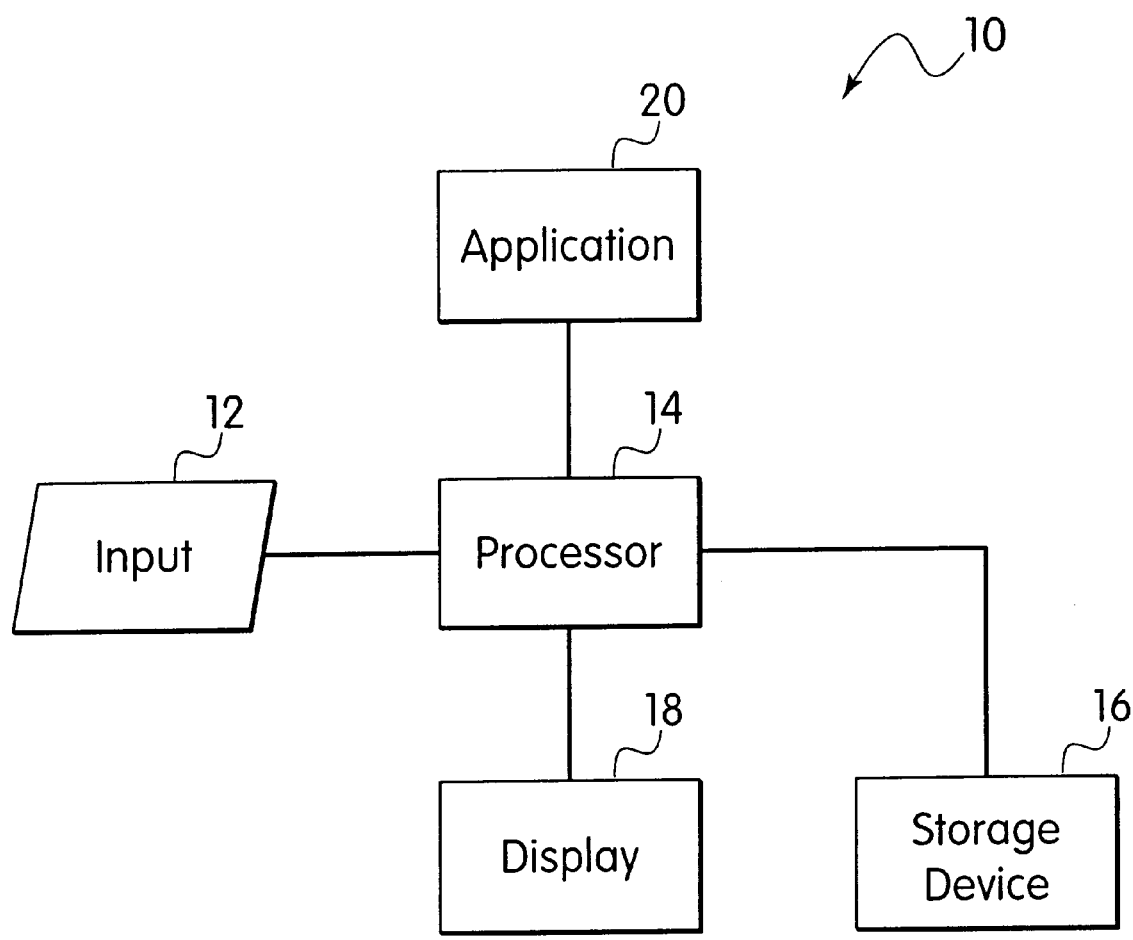
FIG. 1 is a block diagram of a system in accordance with the present invention.

The present invention relates to circuit design tools and, more particularly, to a system and method for selecting sizes of components for integrated circuits. The invention reduces design time for tuning an integrated circuit, for example a VLSI circuit. The invention provides a method for choosing component sizes, preferably transistor sizes, based on both sizing formulas that a designer "attaches" to individual transistors and/or groups of transistors. A spread-sheet-like environment is provided to relate components or devices to propagate changes in sizes and loads at the circuit boundaries to those transistors affected by the changes, thereby making the circuit self-adjusting when a change is made. The invention permits a user, in conjunction with a timing simulator, to rapidly develop a performance profile of area and power versus delay for a given circuit. This enables the designer or user to make an early decision as to whether a change to circuit topology is necessary to meet predetermined criteria.

It should be understood that the elements shown in the FIGS. may be implemented in various forms of hardware, software or combinations thereof. Preferably, these elements are implemented in software on one or more appropriately programmed general purpose digital computers having a processor and memory and input/output interfaces. Referring now to the drawings and initially to FIG. 1, a block diagram of a system 10 for sizing transistors is shown. System 10 includes a user input device 12, preferably a keyboard and/or a mouse, for entering or selecting circuit information to be processed by a processor 14. Processor 14 stores the user input information into a storage device 16. A display 18 is associated with the processor 14 for displaying prompts, forms, entered data, program messages output, etc. for the user. Processor 14 implements the method of the present invention and employs memory space in memory storage device 16 for implementing algorithms programmed in software. A circuit topology is input into processor 14 by either defining nodes and objects representing physical devices. Alternately, a schematic diagram may be entered directly into processor 14 wherein objects are defined by a set of predetermined graphic symbols. The method of the present invention provides the ability of attaching formulas to the objects for example, to transistors and parameterized subcircuits (P-cells) indicating how these objects are sized as functions of node loads or other circuit parameters. Processor 14 employs mathematical expressions appropriately programmed as formulas to size and resize circuit objects. "Objects" as described herein includes electrical circuit components and devices, parameterized cells, instances of the objects, hierarchical circuits, vectorized components, etc. Instances are described in several places in the disclosure and represent an object under varying conditions. The use of the terms objects and instances may be used interchangeably to describe the present invention.

In one embodiment, sizes of transistors in a schematic diagram are analyzed and sized. System 10 replaces explicit capacitors by equivalent transistors that have a gate width that provides the same values of effective capacitance as the explicit capacitors. This allows the system to recognize loads in terms of units of transistor gate width instead of units of capacitance and enables a user to more intuitively see the effects of amplification and gain buildup in a circuit to be designed. The conversion from capacitance to equivalent transistor gate width is preferably accomplished using the formula:

$$\text{width} = \text{capacitor conversion factor} \times \text{capacitance}$$

where the capacitor conversion factor is a value assignable by a user or a defaulted value for a particular type of capacitor. Calculations performed by system 10 maintain the same units. For example, capacitors may have units of farads and transistor widths may have units of meters. The suffixes "f" and "u" in the capacitor and transistor values are simply shorthand for $\times 10^{-15}$ and $\times 10^{-6}$ respectively.

System 10 sizes hierarchical circuits having subcircuit object symbols. System 10 computes terminal loads for each subcircuit instance and places these loads as capacitors. These placed capacitors may be invisible, i.e. they do not appear in the schematic for the circuit since they are not real devices and only model physical properties. The invisible capacitors are placed for the subcircuit instance before descending into the subcircuit schematic and sizing the subcircuit schematic.

In a preferred embodiment, system 10 includes a software application program 20 for selecting transistor sizes, etc. in accordance with the present invention. The software application is executed by processor 14 when the user executes a load command. The software program may be written in any computer language, however, it is preferable to be written in SKILL and run in a Cadence Design System available commercially from Cadence, Inc. For ease of use, the software application may provide a menu driven interface displayed on the display 18.

Figure 2:
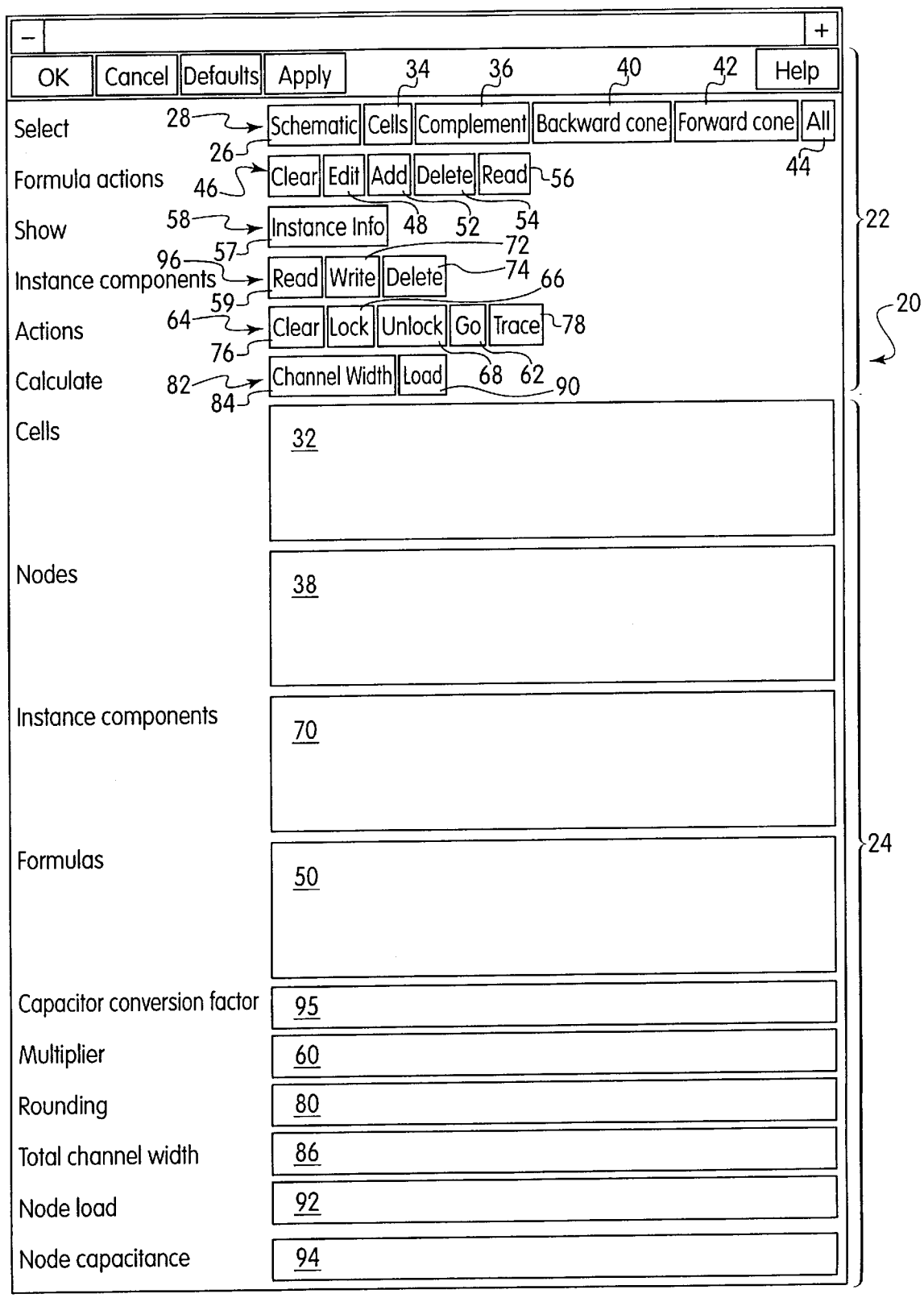
FIG. 2 is a form for recording inputs and receiving outputs in accordance with the present invention.

Referring to FIG. 2, a form 20 is shown. Form 20 is used to guide the user through the sizing method in accordance with the present invention. In a preferred embodiment, form 20 has icons 22 or virtual buttons displayed on display 18 (FIG. 1). A cursor is directed by the user using input device 12 (FIG. 1), and various functions are performed by activating icons 22 or clicking in a text field 24 and entering alphanumeric data as needed. Functions of the invention are described hereinafter in terms of form 20. "Clicking" is referred to as moving a mouse or arrow key driven cursor onto an area of form 20 and depressing a mouse button to activate that function or enter data in that area.

A working schematic is selected by clicking on a schematic button 26 in a select button row 28. A menu, window or listing of preloaded schematic diagrams are made available for selection. Schematic diagrams may be designed and drawn using the Cadence Design System and stored in storage device 16 for use with system 10. The schematic diagram is selected and brought up on display 18. Object selection features provide the user with the capability of selecting objects or instances within the schematic, for example, cells, complement, etc. To select all objects of a subcircuit or transistor type in the working schematic, the name of the subcircuit or transistor type is clicked on in a cells window 32 and then a cells button 34 may be activated. All objects not selected may be selected by clicking on a complement button 36. Objects in a cone of influence may be selected. Cones of influence include all objects driving (backward cone) or being driven by (forward cone) a node in the working schematic. A node is selected from a nodes window 38 either a backward cone of influence button 40 (to select all objects in the backward cone of influence) or a forward cone of influence button 42 (to select all objects in the forward cone of influence) is then activated. By clicking an all button 44, all objects are selected in the working schematic.

A formula actions button row 46 provides a plurality of buttons for performing calculations associated with objects. To create formulas, the user clicks on an edit button 48 to bring up a text or equation editor for creating and editing formulas. The text or equation editor may be selected from any number of commercially available software programs and may be specified as a default editor for the software application in accordance with the present invention. When a save or exit procedure is performed in the editor, the formulas appear in a formulas window 50.

To attach one or more formulas displayed in formulas window 50 to one or more objects, the formula or formulas are selected by clicking on them in formulas window 50 and then the objects are selected by clicking on the objects directly. An add button 52 is activated to associate the selected formulas to the selected objects. To delete all formulas from one or more objects, the objects are selected and a delete button 54 is activated. To later determine all the formulas for each object or group of objects, the objects are selected in the schematic and a read button 56 is activated to display all the formulas for the object or group of objects in formulas window 50. By clicking on an instance info button 57 in a show button row 58, the formulas attached to the various instances are displayed in formulas window 50.

Formulas that set widths of transistors directly have a syntax of:

$w$=expression where "expression" is any valid mathematical expression, preferably written in SKILL. One example of a formula used is:

$w$=max(2 u,nodeLoad(out)/20 which computes the transistor width as the maximum of either 2 u meters or the load at node out divided by 20. Formulas that set the values of size parameters for P-cells have the syntax:

parameter=expression.

The software application provides a plurality of built-in functions stored in storage device 16 for calculating terminal and node loads and accessing transistor widths and P-cell parameter values. Some of these functions are described below for illustrative purposes.

termLoad(instance.terminal). This function computes a load seen by "terminal" of subcircuit "instance". This load calculation does not include a self-load presented by "terminal". If "instance" refers to the subcircuit instance that the formula is attached to, "instance" may be omitted along with the separator ".". The combination instance.terminal is specified as a scalar subcircuit instance terminal. If the subcircuit instance name is a vector, "instance" refers to on of its components. For example, if the subcircuit instance name is I1<0:3> then "instance" is one of I1<0>, I1<2> or I1<3>. The same rule applies to "terminal".

nodeLoad(node). This function computes the load at "node".

width(transistor). This function returns the width of a metal oxide semiconductor (MOS) "transistor".

par(instance.parameter). This function returns the value of "parameter" belonging to P-cell "instance". This function follows the same rules as the termLoad( ) function as described above.

multiplier. This refers to a value of a multiplier in a multiplier field 60 in form 20.

Other functions are contemplated for use with specific applications as well as user defined functions.

For P-cell gates, a frequently used formula pair may be attached to a particular gate. The formula pair has the form:

PNW=max(2 u,termLoad($Y$)/(0.8*mulitplier))

PPW=$m$*par(PNW)

where 2 u meters is the minimum value of PNW (PNW is parameter NMOS transistor width and PPW is parameter PMOS transistor width), the ratio of PPW to PNW is m where m is a technology dependent variable which, for example, depends on electron mobility. m may be set to 2 for the examples that follow. The relative driving strength of the gate relative to an invertor is 0.8 and the output terminal of the P-cell gate is labeled Y. Using the value of the multiplier in multiplier field 60 of form 20, the user may simultaneously size all the gates in a circuit relative to a single criteria. The user may iteratively change the multiplier until a desired criteria is met, for example circuit speed. In this way, a circuit can be brought into "spec" very quickly. The formulas, through the use of termLoado, automatically adjust parts of the circuit for varying fanout and load conditions. The same methods for termLoad( ) and multiplier can be applied to formulas attached to individual transistors. Common terminal names for transistor include drain (D), gate (G), and source (S).

After all formulas are assigned to instances in the working schematic to be analyzed, the circuit is sized in accordance with the present invention by clicking on a go button 62 in an actions row 64 of form 20. The working schematic is sized according to the assigned formulas. System 10 advantageously sizes objects by holding a length constant for the object and determines width according to the width formula described above. Formulas may be cleared by activating a clear Button 47.

Selected instances, for example subcircuits and transistors, may be locked to prevent the software application from sizing them. Locking is performed by selecting the desired instances to be locked and clicking on a lock button 66 in actions row 64 of form 20. Similarly, these instances may be unlocked so that the software application can size them, by selecting the instances and clicking on an unlock button 68. To determine which instances are locked, instance info button 57 in show button row 58 is activated.

If multiple instances of a non-parameterized subcircuit appear in the working schematic hierarchy, the software application does not know which instance to use for sizing that subcircuit as each instance may be looking into a different load. One method calls for locking all instances except for the one that is desired to be used to size the subcircuit. Locking and unlocking of subcircuit instances and transistors may be used in conjunction with cone-of-influence object selection to perform special sizings along critical paths.

The software application cannot size a subcircuit instance with a vector name, I1<0:3>, unless a component is identified to be used for sizing, for example one of I1<0>, I1<1>, I1 <2> or I1<3>, since each component may be looking into a different load. To identify the component to be used, select the instance and click on read button 59. In an instance components window 70, the components of an instance are displayed. By selecting an instance and clicking on a write button 72 the instance is selected for use in sizing. To delete the selection click on a delete button 74. To remove all information from the working schematic click on a clear button 76.

Data may be traced in the working schematic for debugging purposes. By clicking on a trace button 78, a file is created which may be saved and used for diagnosing problems or simply recording data.

A rounding field 80 is provided for entering a value which controls the round-off of transistor widths and P-cell parameters. For example, the value 0.1 u specifies rounding to the nearest $1 \times 10^{-7}$.

The software application provides several useful functions for calculating circuit data which are accessed via a calculate button row 82. To calculate a total transistor channel width for the circuit, click on a channel width button 84. The results are displayed in a total channel width field 86. To calculate loads on a particular node, the node is selected in nodes window 38, then a load button 90 is clicked on. The results are displayed in units of transistor width in a node load field 92 and in units of capacitance in a node capacitance field 94.

The present invention is further described with reference to the following illustrative examples.

EXAMPLE 1

Sizing Individual Transistors

Figure 3:
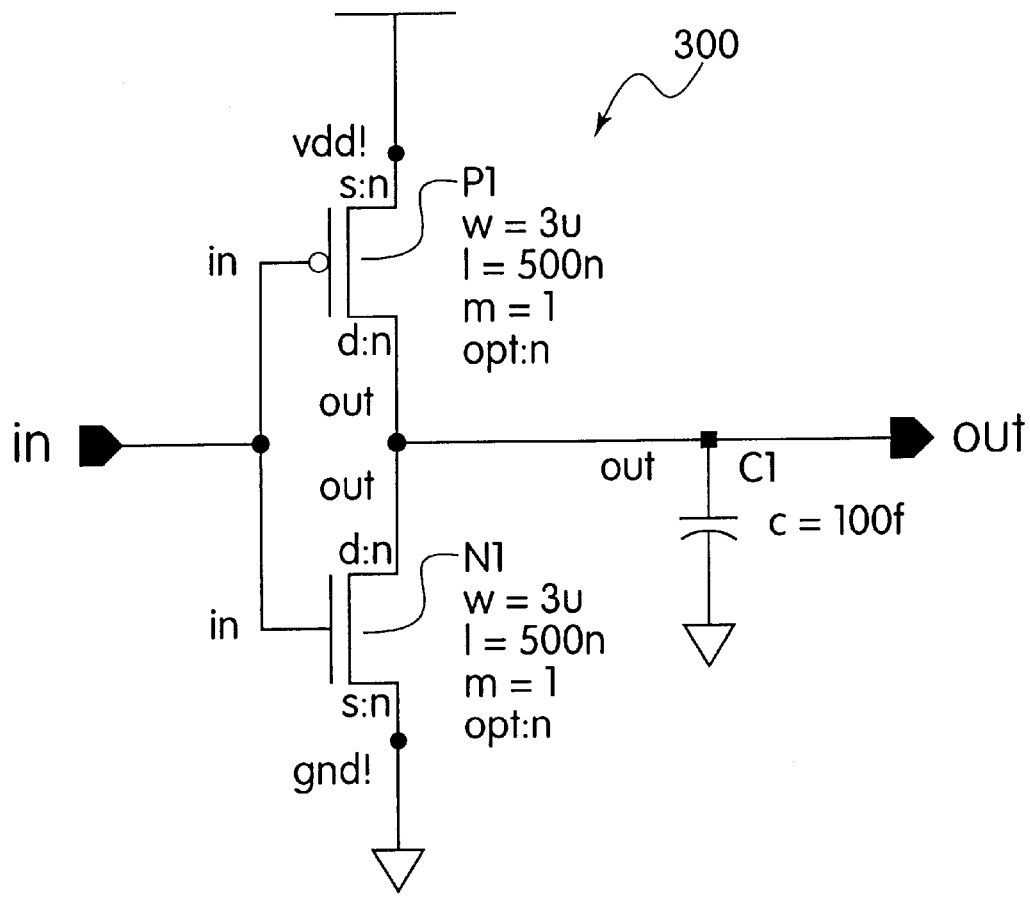
FIG. 3 is a schematic diagram showing transistor sizing in accordance with the present invention.

Referring to the circuit in FIG. 3, a schematic diagram for circuit 300 is shown. The formulas are implemented as follows:

$$w=\max(2\ u, \text{termLoad}(D)/100) \quad \text{Formula (1)}$$

$$w=m^*\text{width}(N1) \quad \text{Formula (2)}$$

in that order. Formula (1) is assigned to transistor N1 and Formula (2) to transistor P1. These steps may be verified by clicking on instance info button 57. By clicking go button 62 in actions row 64, the new transistor widths are generated and displayed. In this example, a width of 2.0 u for transistor N1 and 4.0 u for transistor P1 are obtained for a value of m=2.

Formula (1) prompts to the software application to compute the width of transistor N1 as the maximum of either 2 u meters (2 $\mu$m) or the load seen by the drain terminal (d:n) of N1 divided by 100. This formula is evaluated as $$w=\max(2\ u, ((1.625\ u/1\ f)^*100\ f)/100)=\max(2\ u, 162.5\ u/100)= \max(2\ u, 1.625\ u)=2\ u$$

where the factor 1.625 u/1 f is the value of the capacitor conversion factor (entered into a capacitor conversion factor field 95). Formula (2) is evaluated as $$w=2^*\text{width}(N1)=2^*2\ u=4\ u$$

which gives the width of transistor P1.

If the widths given in the first iteration are not acceptable, a change in formula (1) from $$w=\max(2\ u, \text{termLoad}(D)/100)$$

to $$w=\max(2\ u, \text{termLoad}(D)/10) \quad \text{Formula (3)}$$

may be implemented. Formula (1) from N1 is deleted and formula (3) is assigned to N1. A click on go button 62 again results in updated widths. A width of 16.3 u for transistor N1 and 32.5 u for transistor P1 are calculated.

If once again the widths are unacceptable, a further refinement may be implemented by changing formula (3) from $$w=\max(2\ u, \text{termLoad}(D)/10)$$

to $$w=\max(2\ u, \text{termLoad}(D)/\text{multiplier}) \quad \text{Formula (4)}$$

and assigning this formula to transistor N1 (after first deleting the old formula from N1). The multiplier may be set to 100 in multiplier field 60 for this application. By clicking on go button 62 the results may be observed. By including the multiplier in formula (4), a parametric relationship is defined which allows a single variable (parameter) to be changed which can affect a single object (N1) or a plurality of objects by including the multiplier in the formulas.

EXAMPLE 2

Sizing Parameterized Subcircuits

Figure 4:
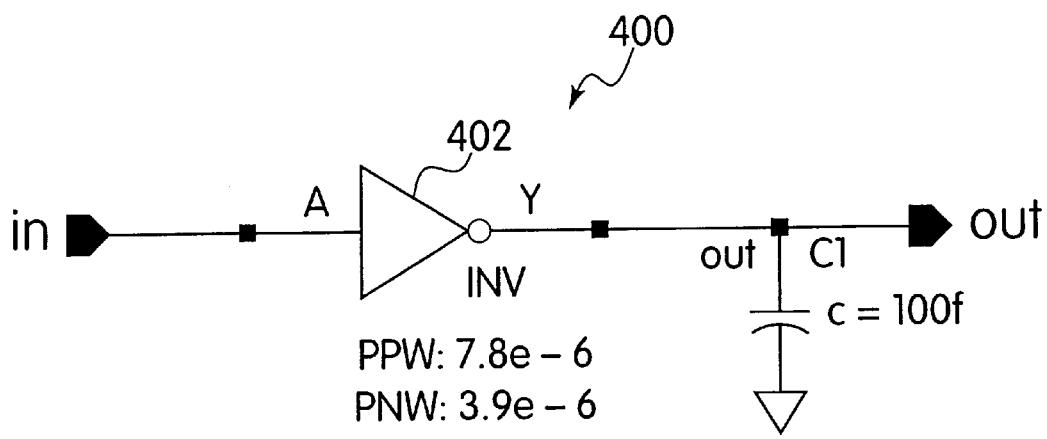
FIG. 4 is a schematic diagram showing parameterized cell sizing in accordance with the present invention.

A circuit 400 as shown in FIG. 4 is constructed and includes a parameterized inverter subcircuit 402. The size parameters of inverter 402 are PNW and PPW. The following formulas are created $$PNW=\max(2\ u, \text{termLoad}(Y)/\text{multiplier})$$

$$PPW=m^*\text{par}(PNW)$$

and assigned to inverter 402. The multiplier field is set to a value. By clicking go button 62 the results are observed (as shown in FIG. 4) and invertor 402 is sized according to the invention.

EXAMPLE 3

Sizing Vectorized Parameterized Subcircuits

Figure 5:
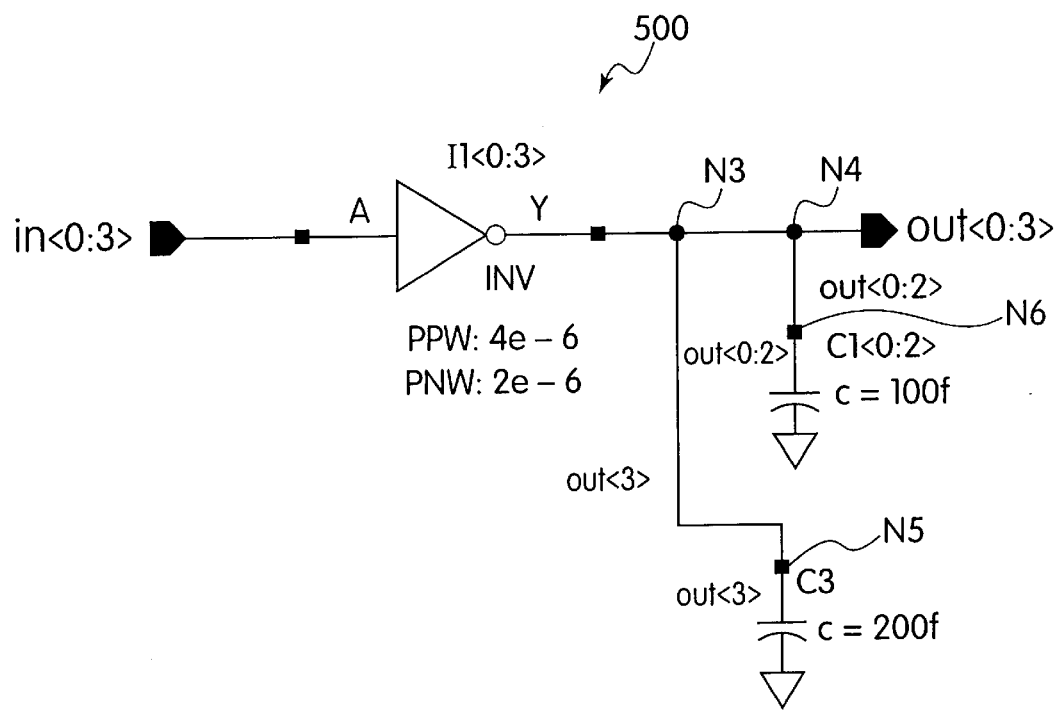
FIG. 5 is a schematic diagram showing vectorized parameterized cell sizing in accordance with the present invention.

A circuit 500 as shown in FIG. 5 is constructed having four inverters bundled into a single, vectorized, parameterized inverter I1. Vectorized inverter I1 is driving four different nodes N3, N4, N5 and N6, each with its own (possibly unique) load. The four driven nodes are to be identified for the software application so the software application knows how to use them to determine the size of the inverter. The formulas are then created. For example, $$PNW=\max(2\ u, \text{termLoad}(I1\ \text{<3>}.Y)/\text{multiplier}$$

$$PPW=m^*\text{par}(PNW)$$

These formulas are assigned to inverter I1. Notice the name qualification in the argument to the termLoad( ) function. The multiplier is assigned a value and results are obtained by activating go button 62.

EXAMPLE 4

Sizing a Staged Buffer

Figure 6:
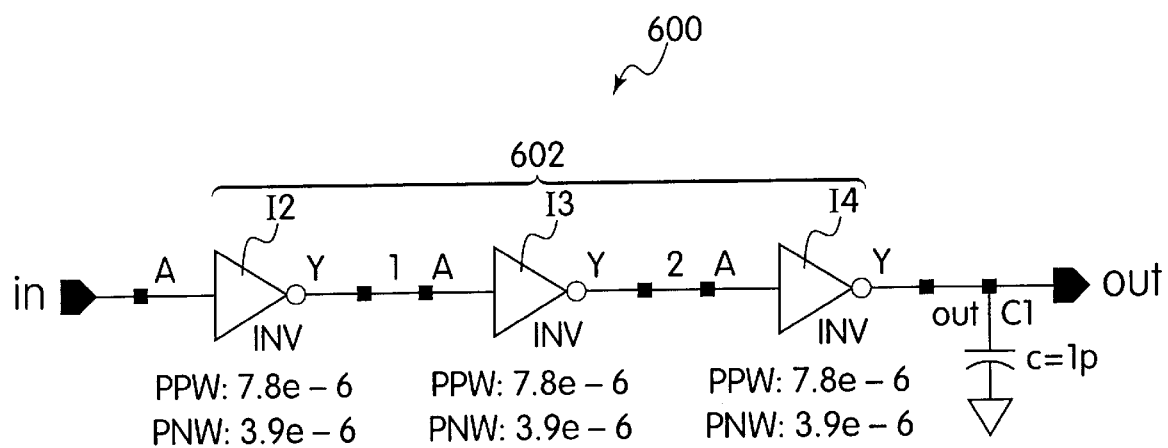
FIG. 6 is a schematic diagram showing buffer sizing in accordance with the present invention.

A circuit 600 as shown in FIG. 6 is constructed and includes a staged buffer 602. The formulas are created, for example, PNW=max(2 u,termLoad(Y)/multiplier)

PPW=$m$*par(PNW)

and assigned to three inverters I2, I3 and I4. Inverters I2, I3 and I4 are sized using predetermined multiplier values. The results are obtained by clicking on go button 62. In this example, the function call par(PNW) returns the value of the parameters PNW of the inverter to which the formula containing the function call is attached. Inverters I2, I3 and I4 may be sized so each stage has the same capacitance gain.

Now, the following formulas may be created and assigned to inverters I2, I3, and I4 as indicated in Table 1.

TABLE 1

| Formula | Inverters |
| --- | --- |
| PNW=2u | I2 |
| PPW=m*par(PNW) | I2, I3, I4 |
| PNW=max(2u,((nodeLoad(out)/nodeLoad(in))**0.333)*par(I2.PNW)) | I3 |
| PNW=max(2u,((nodeLoad(out)/nodeLoad(in))**0.333)*par(I3.PNW)) | I4 |

The inverters are sized and the results are observed (as shown in FIG. 6). Notice that in Table 1 the formulas now fully qualify the parameter names in the par( ) function calls, as these parameters do not belong to the same inverters to which the formulas containing the par( ) function calls are attached.

EXAMPLE 5

Sizing a Hierarchical Circuit

Figure 7:
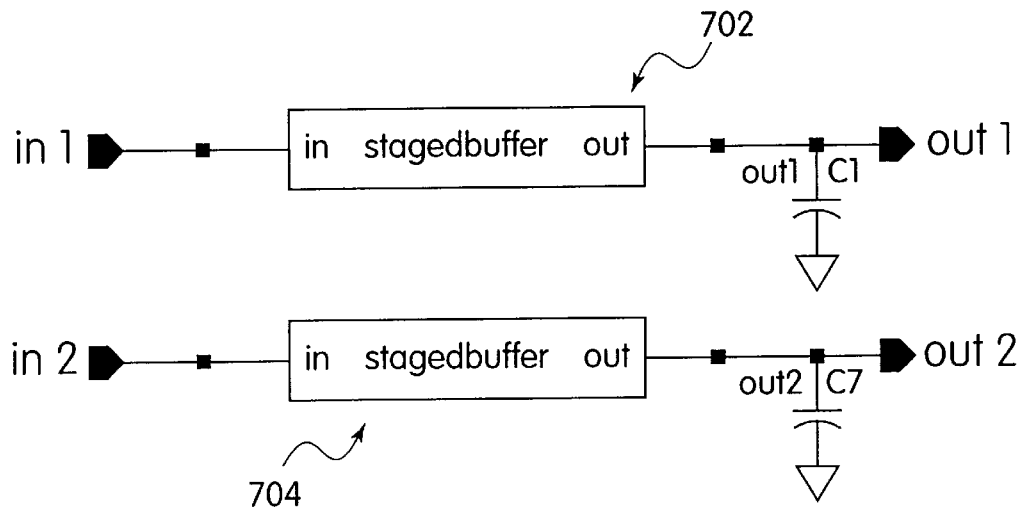
FIG. 7 is a schematic diagram showing hierarchical circuit sizing in accordance with the present invention.

A circuit is created as shown in FIG. 7 which indicates two instances 702 and 704 of a staged buffer similar to circuit 600 of FIG. 6. Each instance is driving a different load (C1 and C7, respectively). The load must be identified to properly size the buffers. By locking instance 704, the software application has been told to use 702 but not 704 to size the staged buffer. By unlocking instance 704 and locking instance 702, the buffer may be sized again based on the load of the instance 704.

EXAMPLE 6

Sizing a Vectorized Hierarchical Circuit

Figure 8:
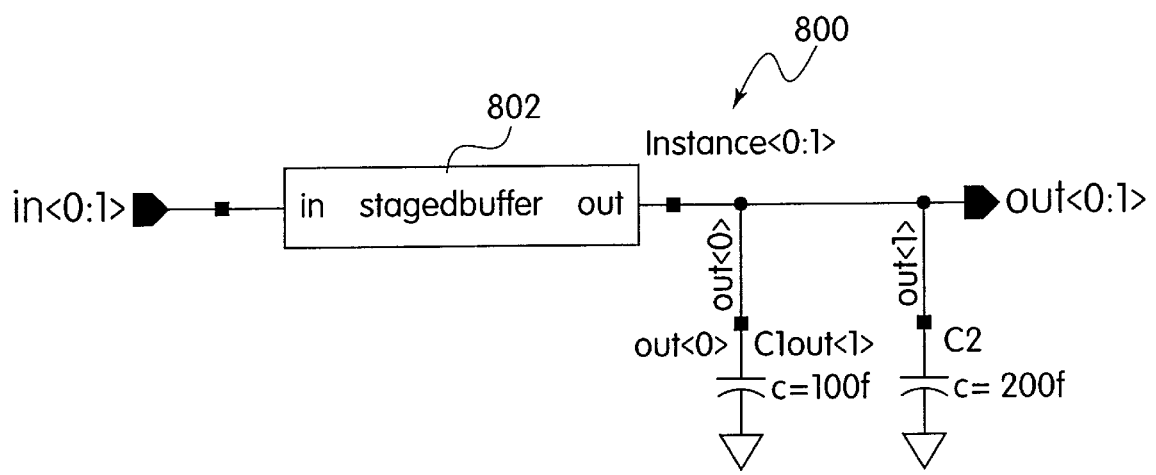
FIG. 8 is a schematic diagram showing vectorized hierarchical circuit sizing in accordance with the present invention.

Circuits 702 and 704 can be redrawn in a vectorized form as a circuit 800 as shown in FIG. 8. Instead of using lock button 66 and unlock button 68 to determine which component of a vectorized, staged buffer subcircuit 802 should be used for the sizing, one of the vector instance components is used for the sizing. One of the buttons in an instance components row 96 on form 20 (FIG. 2) is selected. Circuit 800 is sized for each instance component (Instance <0>, Instance <1>), descending into the schematic for that staged buffer and observing the results.

The foregoing examples are illustrative only. Wire models can be sized using the software application by attaching formulas to the P-cells or transistors driving the wire models that fix the sizes of these objects based on timing and slew results. Typical formulas might be:

PNW=20 u

PPW=$m$*par(PNW).

Then, formulas may be attached as described above to all of the gates and transistors leading up to wire model drivers. In this way, the software application can effectively size circuits with wire models.

Figure 9:
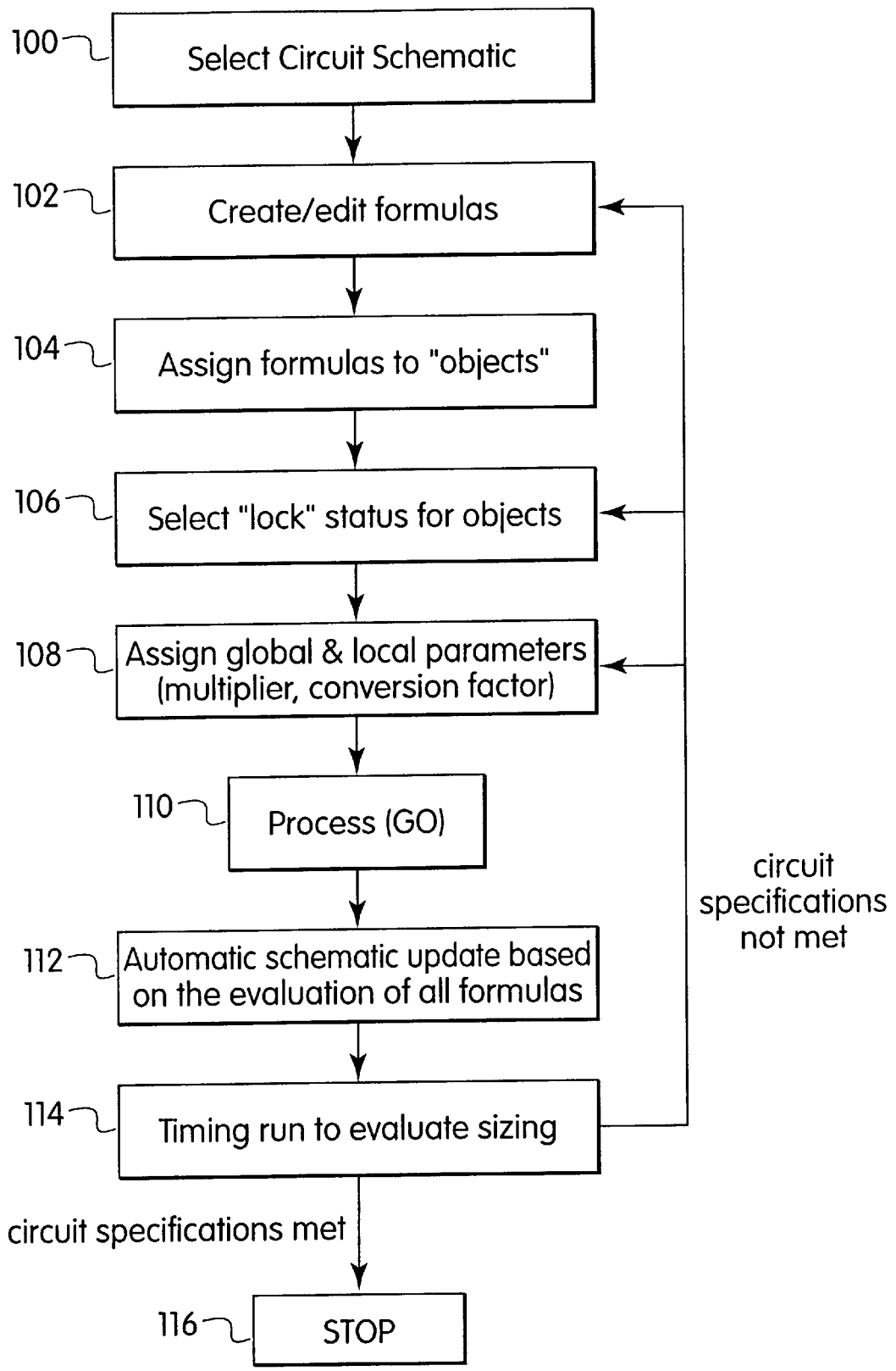
FIG. 9 is a block/flow diagram showing a method and apparatus in accordance with the present invention.

Referring to FIG. 9, a flow/block diagram is shown for the system and method of tuning a circuit in accordance with the present invention. In a block 100, a schematic diagram representing a circuit is selected. The selection of the schematic may be from a menu list or preliminary circuit designs generated by various schematic generation tools, for example computer aided design tools. The schematic diagrams include objects or instances which are recognizable as electrical components within the circuit, for example transistors, capacitors, etc. In a block 102, formulas are created by the user or exist in a built-in library. Formulas are created via a text or equation editor and edited and transferred onto form 20 as described above. In a block 104, formulas are attached to instances or objects to place physical requirements on the circuit being designed.

In a block 106, objects, such as cells, devices, subcircuits, nodes, signals, etc. are locked or unlocked to affect objects that provide critical paths or performance within the circuit. The combination of the locking/unlocking aspect and the cones of influence aspect permits faster and more efficient sizing of the critical paths or features without affecting other less critical paths or features. In this way, desirable aspects of the circuit may be preserved and undesirable aspects may be selectively isolated and improved upon. This permits active hierarchy use to size a larger circuit. Hierarchical circuits are incorporated more easily into the design process in accordance with the present invention. In addition, a more efficient analysis and sizing of critical paths is achieved especially in view of the selectivity provided by locking/unlocking and by the cones of influence features.

Large circuits usually exhibit many symmetries. Using vector notation and vector handling in the design of a circuit conserves these symmetries which in turn leads to more efficient reuse of similar "blocks" of objects in the final layout. The method in accordance with the present invention provides for the use of vector notation and handling in conjunction with the sizing of the circuit.

In a block 108, local and global sizing parameters are assigned. These parameters include a multiplier and a conversion factor. To model all objects present in the circuit, including parasitic devices, all objects are replaced by equivalent transistors. This efficiently replaces the conventional RC modeling of transistors. To represent every device in the circuit as a transistor permits the assumption that all devices (objects) have the same length. This means that only the width remains variable since the physical layout of the circuit is an integrated circuit (having a two-dimensional active area, i.e. length and width). By introducing a capacitance conversion factor, an equivalent transistor per unit capacitance can be represented by a width. This capacitance conversion factor is based on an actual process in terms of its absolute value. The conversion factor may be applied to any technology once the capacitance per unit area of wires and devices is known. By using a single parameter, such as the capacitance conversion factor, the processes used to model a particular design become more efficient and permit faster resizing of circuits in a case of a technology remap.

By introducing a multiplier more control and flexibility is afforded the designer of a circuit during the sizing evaluation. The multiplier is a representation of a gain of a circuit object (device, gate, subsystem, etc.). The multiplier permits rapid prototyping of sizing cycles by using one general control parameter. By changing only one parameter (the multiplier), significant sizing changes are achieved. The multiplier may be limited to single object or a group or subset of objects as opposed to the entire circuit. This allows for increased design flexibility.

In a block 110, processing begins. The formulas attached to each object are calculated in accordance with the feature and global and local parameter assignments. The circuit is analyzed for node voltages, currents, etc. and sized in accordance with the width functions assigned to each object. Objects are relationally linked by both the locking aspect and cones of influence such that when a parameter is defined and updated at a given location in the circuit affected objects are automatically updated in accordance with the criteria defined by the formulas.

In a block 112, the schematic diagram is automatically updated pursuant to the design changes implemented in block 110. By automatically updating the schematic diagram after the sizing cycle in block 110, a faster and more efficient methodology is realized, and manual updates of the schematic diagram are avoided. System 10 is completely interactive with the user. When linked with the ability to assign local and global parameters (for example, capacitance conversion factor and multiplier) a synergistic increase is realized in the speed of circuit sizing.

In block 114, a timing run is completed on the newly sized design to evaluate the design against predetermined criteria. For example, if a critical path requires a delay below a threshold value, the critical path is evaluated to determine if this requirement or specification is met. The timing run may be performed by commercially available software, for example, the delay may be evaluated using Pathmill™, available from EPIC Design Technology, Inc. If all the requirements/specifications are met the method is stopped in block 116. If the requirements/specifications are not met, the program path is returned to blocks 104, 108 or 110. The formulas may be adjusted, different objects may be locked or unlocked and/or reassignment of parameters may be completed to provide another design iteration to resize the circuit. The timing run in block 116 is reevaluated to determine if requirements/specifications have been met, and the process continues until they are met. Implementation of the method of the present invention has resulted in a reduction in design time by about an order of magnitude.

Having described preferred methods of a novel method and system sizing circuits (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of automatically selecting object size in an integrated circuit, by employing a graphical user interface, comprising the steps of:

providing a circuit topology on a graphical user interface having objects disposed therein;

inputting equations associated with the objects such that each object has an individually assigned parametric equation which controls a size of the object to provide sizing adjustment for each object;

assigning parameter values in the equations based on physical constraints of the circuit for one or more objects;

selecting one or more objects to be sized by individually selecting the one or more objects on the graphical user interface; and computing for each selected object and objects influenced by the selected object, a size in accordance with the associated equation until a user defined criteria is achieved for the circuit.

2. The method as recited in claim 1, further comprises the step of outputting a topology with object sizes modified according to the associated equations.

3. The method as recited in claim 1, wherein the objects include transistors.

4. The method as recited in claim 1, wherein the objects include capacitors and further comprising the step of modeling the capacitors as transistors by adjusting a capacitance load of the capacitors in accordance with a capacitance conversion factor.

5. The method as recited in claim 1, wherein the objects include hierarchical circuits.

6. The method as recited in claim 1, wherein the objects include vectorized hierarchical circuits.

7. The method as recited in claim 1, wherein the objects include parameterized cells.

8. The method as recited in claim 1, further comprises the step of calculating node loads for analyzing the circuit in accordance with the user defined criteria.

9. The method as recited in claim 1, wherein the physical constraints include gain and the parameter values include a multiplier.

10. The method as recited in claim 1, further comprises the step of evaluating cones of influence for the objects selected to identify influenced objects that are influenced by a change in the selected object.

11. A program storage device readable by machine, tangibly embodying a program of instructions executable by machine to perform method steps for automatically selecting object size in an integrated circuit, according to claim 1.

12. A method of automatically selecting object size in an integrated circuit, by employing a graphical user interface, comprising the steps of:

providing a circuit topology on a graphical user interface having objects disposed therein;

inputting equations associated with the objects such that each object has an individually assigned parametric equation which controls a size of the object to provide sizing adjustment for each object;

assigning parameter values in the equations based on physical constraints of the circuit for one or more objects;

locking one or more objects in the circuit by individually selecting the one or more objects on the graphical user interface to prevent sizing adjustment to locked objects thereby creating an unlocked subset of objects;

evaluating cones of influence for the subset of objects to identify influenced objects influenced by a change in a selected object; and computing for each of the subset of objects and influenced objects, a size in accordance with the associated equation until a user defined criteria is achieved for the circuit.

13. The method as recited in claim 12, wherein the objects include capacitors and further comprising the step of modeling the capacitors as transistors by adjusting a capacitance load of the capacitors in accordance with a capacitance conversion factor.

14. The method as recited in claim 12, wherein the objects include hierarchical circuits and subcircuits.

15. The method as recited in claim 12, wherein the objects include vectorized hierarchical circuits.

16. The method as recited in claim 12, wherein the objects include parameterized cells.

17. The method as recited in claim 12, further comprises the step of calculating node loads for analyzing the circuit in accordance with the user defined criteria.

18. The method as recited in claim 10, wherein the physical constraints include gain and the parameter values include a multiplier.

19. The method as recited in claim 12, further comprises the step of outputting a topology with objects in the circuit having modified sizes.

20. The method as recited in claim 12, wherein the objects include transistors.

21. A program storage device readable by machine, tangibly embodying a program of instructions executable by machine to perform method steps for automatically selecting object size in an integrated circuit, according to claim 10.

22. A system for automatically selecting object size in an integrated circuit, by employing a graphical user interface, comprising:

a circuit topology having objects disposed therein and displayed on a graphical user interface;

means for inputting equations associated with the objects such that each object has an individually assigned parametric equation which controls a size of the object to provide sizing adjustment for each object, the equations including parameter values for one or more objects based on physical constraints of the circuit;

means for selecting one or more objects to be sized by individually selecting the one or more objects on the graphical user interface;

means for evaluating cones of influence for the objects selected to identify influenced objects influenced by a change in the selected object; and means for computing for each selected object and influenced objects, a size in accordance with the associated equation until a user defined criteria is achieved for the circuit.

23. The system as recited in claim 22, further comprises means for outputting a topology with objects in the circuit sized in accordance with the associated equations.

24. The system as recited in claim 23, wherein the objects include vectorized hierarchical circuits.

25. The system as recited in claim 23, wherein the objects include parameterized cells.

26. The method as recited in claim 23, wherein the physical constraints include values for a gain of the objects and the parameter is a multiplier.

27. The method as recited in claim 23, wherein the means for evaluating cones of influence for the objects includes a processor for analyzing the circuit to identify influenced objects.

28. The system as recited in claim 23, wherein the objects include transistors.

29. The system as recited in claim 23, wherein the objects include capacitors and further comprising a capacitance conversion factor for modeling capacitance loads as transistors.

30. The system as recited in claim 23, wherein the objects include hierarchical circuits.

* * * * *